(12) United States Patent
Peterson et al.

(10) Patent No.: US 10,332,604 B2
(45) Date of Patent: Jun. 25, 2019

(54) CONFIGURATION PARAMETER MANAGEMENT FOR NON-VOLATILE DATA STORAGE

(71) Applicant: SanDisk Technologies LLC, Plano, TX (US)

(72) Inventors: James Peterson, San Jose, CA (US); Gary Janik, San Jose, CA (US); Jea Hyun, Los Altos, CA (US)

(73) Assignee: SanDisk Technologies LLC, Plano, TX (US)

(*) Notice: Subject to any disclaimer, the term of this patent is extended or adjusted under 35 U.S.C. 154(b) by 14 days.

(21) Appl. No.: 15/828,407

(22) Filed: Nov. 30, 2017

(65) Prior Publication Data

US 2018/0090213 A1  Mar. 29, 2018

Related U.S. Application Data

(63) Continuation of application No. 14/601,794, filed on Jan. 21, 2015, now Pat. No. 9,852,799.

(60) Provisional application No. 62/081,681, filed on Nov. 19, 2014.

(51) Int. Cl.

| | |
|---|---|
| *G11C 16/26* | (2006.01) |
| *G11C 8/12* | (2006.01) |
| *G11C 11/56* | (2006.01) |
| *G11C 16/20* | (2006.01) |
| *G11C 16/34* | (2006.01) |
| *G11C 29/02* | (2006.01) |
| *G11C 29/44* | (2006.01) |

(52) U.S. Cl.
CPC ........... *G11C 16/26* (2013.01); *G11C 8/12* (2013.01); *G11C 11/5642* (2013.01); *G11C 16/20* (2013.01); *G11C 16/349* (2013.01); *G11C 16/3418* (2013.01); *G11C 29/028* (2013.01); *G11C 2029/4402* (2013.01); *G11C 2211/5641* (2013.01)

(58) Field of Classification Search
CPC ........... G11C 16/26; G11C 8/12; G11C 16/20; G11C 16/349
USPC .................................. 365/200, 201
See application file for complete search history.

(56) References Cited

U.S. PATENT DOCUMENTS

| | | |
|---|---|---|
| 7,394,692 B2 | 7/2008 | Chen et al. |
| 7,715,239 B2 | 5/2010 | Aritome |
| 7,898,838 B2 | 3/2011 | Chen et al. |
| 8,009,474 B2 | 8/2011 | Nishihara et al. |
| 8,315,092 B2 | 11/2012 | Strasser et al. |
| 8,355,285 B2 | 1/2013 | Huang et al. |

(Continued)

FOREIGN PATENT DOCUMENTS

| | | |
|---|---|---|
| WO | 2008117921 | 10/2008 |
| WO | 2009015313 | 1/2009 |

*Primary Examiner* — Han Yang
(74) *Attorney, Agent, or Firm* — Kunzler Bean & Adamson, PC

(57) ABSTRACT

Apparatuses, systems, and methods are disclosed for managing configuration parameters for non-volatile data storage. A control module is configured to limit erase dwell times for blocks of a non-volatile memory medium to satisfy a threshold. A block classification module is configured to group blocks of a non-volatile memory medium based on retention times for the blocks. A block access module is configured to access at least one group of blocks using a read voltage threshold selected based on a grouping.

20 Claims, 8 Drawing Sheets

(56) References Cited

U.S. PATENT DOCUMENTS

| | | |
|---|---|---|
| 8,380,915 B2 | 2/2013 | Wood et al. |
| 8,644,099 B2 | 2/2014 | Cometti et al. |
| 8,661,184 B2 | 2/2014 | Wood et al. |
| 8,693,252 B2 | 4/2014 | Mun |
| 8,737,136 B2 | 5/2014 | Cometti |
| 9,852,799 B2 | 12/2017 | Peterson et al. |
| 2003/0151950 A1 | 8/2003 | Tamada et al. |
| 2008/0019182 A1 | 1/2008 | Yanagidaira et al. |
| 2010/0124123 A1 | 5/2010 | Lee |
| 2010/0332922 A1 | 12/2010 | Chang et al. |
| 2012/0268994 A1 | 10/2012 | Nagashima |
| 2013/0132652 A1 | 5/2013 | Wood et al. |
| 2014/0101519 A1 | 4/2014 | Lee |
| 2014/0181376 A1* | 6/2014 | Miyamoto .......... G06F 12/0246 711/103 |
| 2014/0195725 A1 | 6/2014 | Bennett |
| 2014/0189215 A1 | 7/2014 | Kang et al. |
| 2014/0198567 A1 | 7/2014 | Mokhlesi |
| 2016/0093387 A1 | 3/2016 | Oh et al. |
| 2017/0221573 A1 | 8/2017 | Darragh et al. |

\* cited by examiner

600 →

| Group 602 | Retention Time (hours) 604 |
|---|---|
| 1 | 1 |
| 2 | 2 |
| 3 | 4 |
| 4 | 8 |
| 5 | 16 |
| 6 | 32 |
| 7 | 48 |
| 8 | 168 |
| 9 | 336 |
| 10 | 720 (1 month) |
| 11 | 1440 (2 months) |
| 12 | 2160 (3 months) |
| 13 | > 2160 |

| Group 652 | Power of Two 654 | Retention Time (seconds) 656 | Retention Time (hours) 658 | Retention Time (days) 660 |
|---|---|---|---|---|
| 1 | 12 | 4096 | 1.1 | 0.05 |
| 2 | 13 | 8192 | 2.3 | 0.09 |
| 3 | 14 | 16384 | 4.6 | 0.19 |
| 4 | 15 | 32768 | 9.1 | 0.38 |
| 5 | 16 | 65536 | 18.2 | 0.76 |
| 6 | 17 | 131072 | 36.4 | 1.52 |
| 7 | 18 | 262144 | 72.8 | 3.03 |
| 8 | 19 | 524288 | 145.6 | 6.07 |
| 9 | 20 | 1048526 | 291.3 | 12.14 |
| 10 | 21 | 2097152 | 582.5 | 24.27 |
| 11 | 22 | 4194304 | 1165.1 | 48.55 |
| 12 | 23 | 8388608 | 2330.2 | 97.09 |
| 13 | | > 8388608 | > 2330.2 | > 97.09 |

FIG. 6B

CONFIGURATION PARAMETER MANAGEMENT FOR NON-VOLATILE DATA STORAGE

CROSS-REFERENCES TO RELATED APPLICATIONS

This is a continuation application of and claims priority to U.S. patent application Ser. No. 14/601,794 entitled "CONFIGURATION PARAMETER MANAGEMENT FOR NON-VOLATILE DATA STORAGE" and filed on Jan. 21, 2015, for James Peterson, et al., which claims the benefit of U.S. Provisional Patent Application No. 62/081,681 entitled "CONFIGURATION PARAMETER MANAGEMENT FOR NON-VOLATILE DATA STORAGE" and filed on Nov. 19, 2014, for James Peterson, et al., each of which is incorporated herein by reference.

TECHNICAL FIELD

The present disclosure, in various embodiments, relates to data storage and more particularly relates to configuration parameters for non-volatile media.

BACKGROUND

Several types of data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

The data-encoding physical property of a cell may vary over time due to cell damage, charge leakage, temperature effects, disturbances from nearby cells, or the like. An error may occur if the cell moves from one state into an adjacent state. As storage density increases, feature size shrinks, making the cells more susceptible to such disturbances. Appropriate management of various configuration parameters may reduce error rates by compensating for such disturbances.

Configuration parameters may be managed differently for different blocks of non-volatile storage cells. For example, a first block with a long data retention time may be susceptible to charge leakage that lowers stored voltages, but a second block may be more susceptible to raised voltages, due to disturbances from programming nearby cells. Thus, managing configuration parameters may include lowering the read voltage thresholds between states for the first block, but raising the read voltage thresholds for the second block. Managing configuration parameters separately for each block may account for arbitrary variations between blocks, but may also be resource-intensive.

SUMMARY

Methods are presented for managing configuration parameters for non-volatile data storage. In one embodiment, a method includes programming and erasing blocks of a non-volatile storage medium such that variation of an erase dwell time for the blocks remains within a predetermined range. In certain embodiments, a method includes grouping blocks of a non-volatile storage medium based on retention times for the blocks. In certain embodiments, a method includes accessing at least one group of blocks using a configuration parameter selected based on a grouping.

Apparatuses are presented for managing configuration parameters for non-volatile data storage. In one embodiment, a control module is configured to limit erase dwell times for blocks of a non-volatile memory medium to satisfy a threshold. In certain embodiments, a block classification module is configured to group blocks of a non-volatile memory medium based on retention times for the blocks. In a further embodiment, a block access module is configured to access at least one group of blocks using a read voltage threshold selected based on a grouping.

Systems are presented for managing configuration parameters for non-volatile data storage. A system, in one embodiment, includes a non-volatile storage device and a controller for the non-volatile storage device. In certain embodiments, a non-volatile recording device includes a non-volatile storage medium. In one embodiment, a controller manages variation erase dwell times for blocks of a non-volatile storage medium. In a further embodiment, a controller categorizes blocks into groups based on retention times. In certain embodiments, a controller configures different groups to use different read voltage thresholds based on retention times.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which:

FIG. 6A is a table illustrating one embodiment of groups for blocks of a non-volatile storage medium;

FIG. 6B is a table illustrating another embodiment of groups for blocks of a non-volatile storage medium;

DETAILED DESCRIPTION

Figure 1:
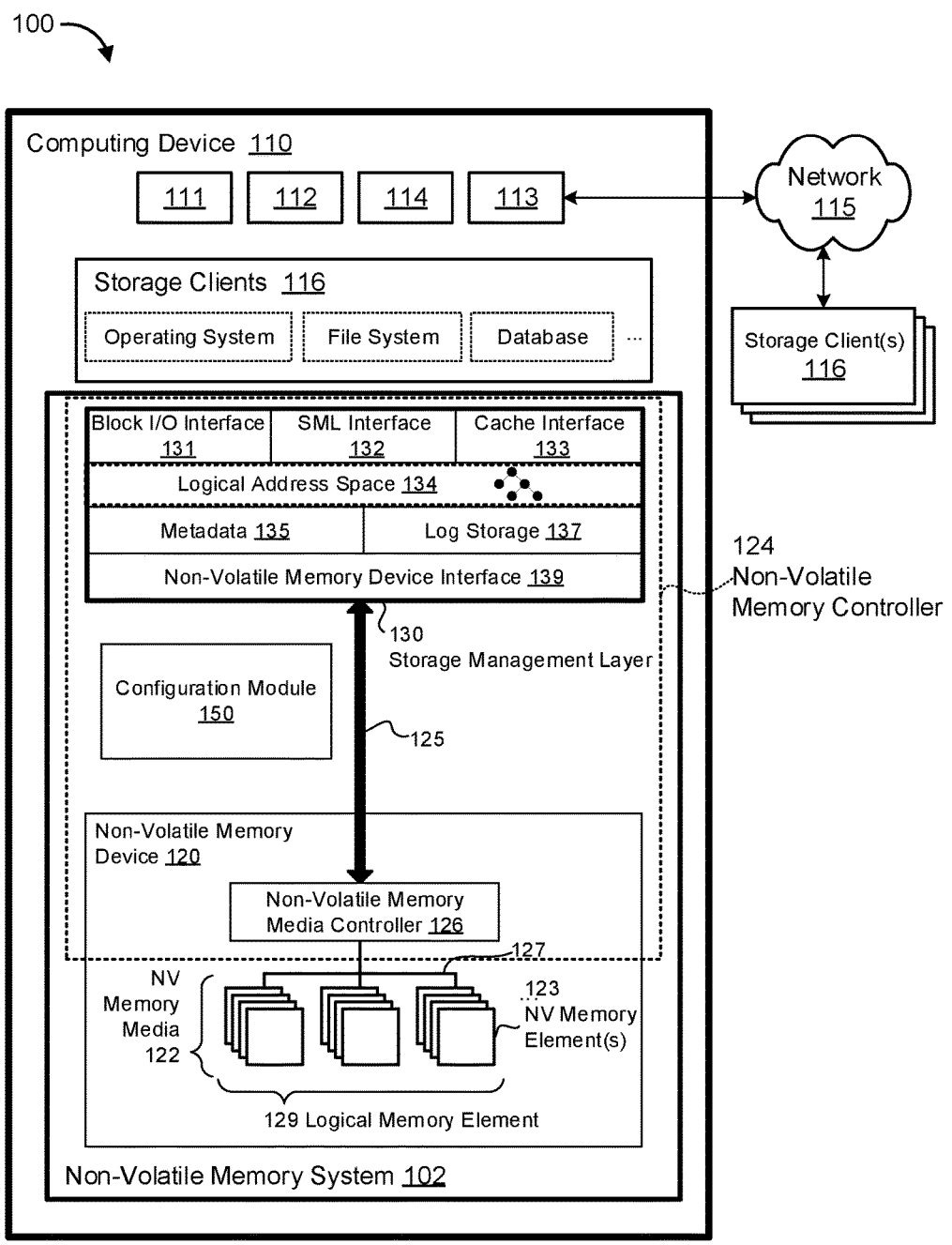
FIG. 1 is a schematic block diagram illustrating one embodiment of a system comprising a configuration module.

Aspects of the present disclosure may be embodied as an apparatus, system, method, or computer program product.

Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising a configuration module 150. The configuration module 150 may be part of and/or in communication with one or more of a non-volatile memory controller 124, a non-volatile memory media controller 126, a device driver or storage management layer (SML) 130, or the like. The configuration module 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the configuration module 150 may be embodied as one or more computer readable instructions stored on the non-transitory storage media 114.

The non-volatile memory system 102, in the depicted embodiment, includes a configuration module 150. The configuration module 150, in one embodiment, is configured to manage differences in one or more storage characteristics for blocks of the non-volatile memory medium 122, group the blocks based on one or more other storage characteristics, and use a configuration parameter for at least one of the groups of blocks based on the grouping. Managing differences in storage characteristics may reduce variation between blocks, making it practical to group the blocks according to other storage characteristics and to use a configuration parameter for a whole group of blocks instead of using different configuration parameters for each block in the group. Compared to per-block configuration parameter management, per-group configuration parameter management may use less memory for storing configuration parameters, less computation time for determining configuration parameters, and/or less bandwidth for controlling configuration parameters when accessing different blocks.

For example, in certain embodiments, the configuration module 150 may manage or control wear leveling to provide consistent program/erase (P/E) cycle counts for erase blocks of a non-volatile memory device 120, may manage or control an erase dwell time of a non-volatile memory device 120, and/or may manage or control another storage characteristic for the non-volatile memory device 120. By controlling certain characteristics or parameters of a non-volatile memory device 120, in one embodiment, the configuration module 150 limits the number of remaining characteristics that may affect an error rate, voltage drift, or the like, so that the configuration module 150 may more easily group blocks using the remaining characteristics and use the same set of configuration parameters for the entire group, reducing overhead of determining, managing, and using the configuration parameters, such as read voltage thresholds or the like.

In one embodiment, the configuration module 150 may comprise executable software code, such as a device driver, SML 130, or the like, stored on the computer readable storage media 114 for execution on the processor 111. In another embodiment, the configuration module 150 may comprise logic hardware of one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the configuration module 150 may include a combination of both executable software code and logic hardware. The configuration module 150 is described in greater detail below with regard to FIGS. 3 and 4.

According to various embodiments, a non-volatile memory controller 124 comprising the configuration module 150 may manage one or more non-volatile memory devices 120. The non-volatile memory device(s) 120 may comprise recording, memory, and/or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, erase blocks, sectors, blocks, collections or sets of physical storage locations (e.g., logical pages, logical erase blocks, described below), or the like.

The non-volatile memory controller 124 may comprise an SML 130, which may present a logical address space 134 to one or more storage clients 116. One example of an SML is the Virtual Storage Layer® of SanDisk Corporation of Milpitas, Calif. Alternatively, each non-volatile memory device 120 may comprise a non-volatile memory media controller 126, which may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML 130 may maintain metadata 135, such as a forward index, to map logical addresses of the logical address space 134 to media storage locations on the non-volatile memory device(s) 120. The SML 130 may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML 130 may map logical addresses to physical data resources of any size and/or granularity, which may or may not correspond to the underlying data partitioning scheme of the non-volatile memory device(s) 120. For example, in some embodiments, the non-volatile memory controller 124 is configured to store data within logical memory units that are formed by logically combining a plurality of physical memory units, which may allow the non-volatile memory controller 124 to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

The logical address space 134 presented by the SML 130 may have a logical capacity, which may correspond to the number of available logical addresses in the logical address space 134 and the size and/or granularity of the data referenced by the logical addresses. For example, the logical capacity of a logical address space 134 comprising 2^32 unique logical addresses, each referencing 2048 bytes (2 KiB) of data may be 2^43 bytes. As used herein, a kibibyte (KiB) refers to 1024 bytes. In some embodiments, the logical address space 134 may be thinly provisioned. As used herein, a "thinly provisioned" logical address space 134 refers to a logical address space 134 having a logical capacity that exceeds the physical capacity of the underlying non-volatile memory device(s) 120. For example, the SML 130 may present a 64-bit logical address space 134 to the storage clients 116 (e.g., a logical address space 134 referenced by 64-bit logical addresses), which may exceed the physical capacity of the underlying non-volatile memory devices 120. The large logical address space 134 may allow storage clients 116 to allocate and/or reference contiguous ranges of logical addresses, while reducing the chance of naming conflicts. The SML 130 may leverage the any-to-any mappings between logical addresses and physical storage resources to manage the logical address space 134 independently of the underlying physical storage devices 120. For example, the SML 130 may add and/or remove physical storage resources seamlessly, as needed, and without changing the logical addresses used by the storage clients 116.

The non-volatile memory controller 124 may be configured to store data in a contextual format. As used herein, a contextual format refers to a self-describing data format in which persistent contextual metadata is stored with the data on the physical storage media 122. The persistent contextual metadata provides context for the data with which it is stored. In certain embodiments, the persistent contextual metadata uniquely identifies the data with which the persistent contextual metadata is stored. For example, the persistent contextual metadata may uniquely identify a sector or block of data owned by a storage client 116 from other sectors or blocks of data owned by the storage client 116. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In certain embodiments, the persistent contextual metadata identifies at least one of a plurality of aspects, including data type, a unique data identifier, an operation, and a sequence of operations performed on the data.

The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media 122, a memory division index, or the like).

In some embodiments, the contextual data format may allow data context to be determined and/or reconstructed based upon the contents of the non-volatile memory media 122, and independently of other metadata, such as the arbitrary, any-to-any mappings discussed above. Since the media location of data is independent of the logical address of the data, it may be inefficient or impossible to determine the context of data based solely upon the media location or media address of the data. Storing data in a contextual format on the non-volatile memory media 122 may allow data context to be determined without reference to other metadata. For example, the contextual data format may allow the metadata to be reconstructed based only upon the contents of the non-volatile memory media 122 (e.g., reconstruct the any-to-any mappings between logical addresses and media locations).

In some embodiments, the non-volatile memory controller 124 may be configured to store data on one or more asymmetric, write-once media 122, such as solid-state storage media. As used herein, a "write once" storage medium refers to a storage medium that is reinitialized (e.g., erased) each time new data is written or programmed thereon. As used herein, an "asymmetric" storage medium refers to a storage medium 122 having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media).

The memory media 122 may be partitioned into memory divisions that can be erased as a group (e.g., erase blocks) in order to, inter alia, account for the asymmetric properties of the media 122 or the like. As such, modifying a single data segment in-place may require erasing the entire erase block comprising the data, and rewriting the modified data to the erase block, along with the original, unchanged data. This may result in inefficient "write amplification," which may excessively wear the media 122. Therefore, in some embodiments, the non-volatile memory controller 124 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller 124 may comprise one or more processes that operate outside of the regular path for servicing of storage operations (e.g., the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client 116, identifying the logical addresses of the request, performing one or more storage operations on non-volatile memory media 122, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller 124 comprises a groomer, which is configured to reclaim memory divisions (e.g., logical or physical erase blocks) for reuse, using a garbage collection or other storage capacity recovery process. The write out-of-place paradigm implemented by the non-volatile memory controller 124 may result in obsolete or invalid data remaining on the non-volatile memory media 122. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media 122 may accumulate a significant amount of invalid data.

A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller 124 may be further configured to store data in a log format. As described above, a log format refers to a data format that defines an ordered sequence of storage operations performed on a non-volatile memory media 122. In some embodiments, the log format comprises storing data in a pre-determined sequence of media addresses of the non-volatile memory media 122 (e.g., within sequential pages and/or erase blocks of the media 122). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments, the log format may comprise storing data in an "append only" paradigm. The non-volatile memory controller 124, using the log storage module 137 described below or the like, may maintain a current append point at a media address of the non-volatile memory device 120. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller 124 may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media 122, and independently of other metadata. As discussed above, invalid data may not be removed from the non-volatile memory media 122 until the memory division comprising the data is reclaimed. Therefore, multiple "versions" of data having the same context may exist on the non-volatile memory media 122 (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

The storage management layer 130 may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, hard drives, SAN storage resources, or the like. The one or more non-volatile memory devices 120 may comprise one or more respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., a large, virtual address space 134) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations the on one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 124 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 124 comprises one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change RAM (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on and/or read data from the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (e.g., a page of each element of non-volatile memory media 122).

The non-volatile memory controller 124 may comprise an SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (e.g., through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
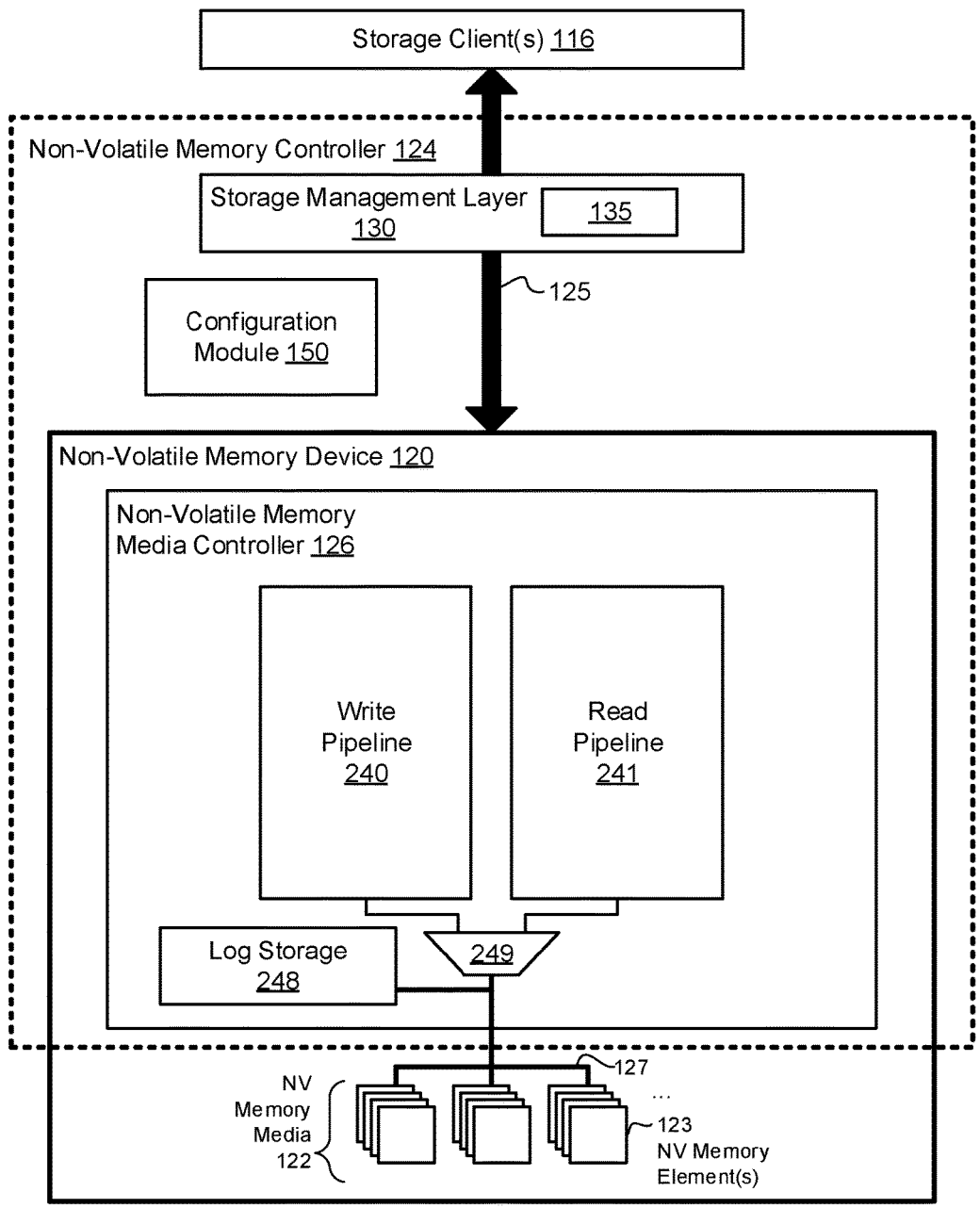
FIG. 2 is a schematic block diagram illustrating a further embodiment of a system comprising a configuration module.

FIG. 2 depicts another embodiment of a non-volatile memory controller 124 configured to manage configuration parameters. The non-volatile memory device 120 may comprise a non-volatile memory media controller 126 and non-volatile memory media 122. The non-volatile memory media 122 may comprise a plurality of non-volatile memory elements 123, which may be communicatively coupled to the non-volatile memory media controller 126 via a bus 127, as described above.

The non-volatile memory media controller 126 may comprise a write pipeline 240 that is configured to store data on the non-volatile memory media 122 in a contextual format in response to requests received via the bus 125. The requests may include and/or reference data to be stored on the non-volatile memory media 122, may include logical address(es) of the data, and so on. As described above, the contextual format may comprise storing a logical address of the data in association with the data on the non-volatile memory media 122. For example, the write pipeline 240 may be configured to format data into packets, and may include the logical address of the data in a packet header or other packet field. The write pipeline 240 may be configured to buffer data for storage on the non-volatile memory media 122. In some embodiments, the write pipeline 240 may comprise one or more synchronization buffers to synchronize a clock domain of the non-volatile memory media controller 126 with a clock domain of the non-volatile memory media 122 and/or bus 127.

The log storage module 248 may be configured to select media location(s) for the data and may provide addressing and/or control information to the non-volatile memory elements 123 via the bus 127. In some embodiments, the log storage module 248 is configured to store data sequentially in a log format within the non-volatile memory media. The log storage module 248 may be further configured to groom the non-volatile memory media, as described above. In certain embodiments, the log storage module 248 is substantially similar to the log storage module 137 as described above. The log storage module 248 may be executed by the SML 130 and/or by the non-volatile memory media controller 126.

Upon writing data to the non-volatile memory media, the non-volatile memory media controller 126 may be configured to update metadata 135 (e.g., a forward index) to associate the logical address(es) of the data with the media address(es) of the data on the non-volatile memory media 122. In some embodiments, the metadata 135 may be maintained on the non-volatile memory media controller 126; for example, the metadata 135 may be stored on the non-volatile memory media 122, on a volatile memory (not shown), or the like. Alternatively, or in addition, the metadata 135 may be maintained within the SML 130 (e.g., on a volatile memory 112 of the computing device 110 of FIG. 1). In some embodiments, the metadata 135 may be maintained in a volatile memory by the SML 130, and may be periodically stored on the non-volatile memory media 122.

The non-volatile memory media controller 126 may further comprise a read pipeline 241 that is configured to read contextual data from the non-volatile memory media 122 in response to requests received via the bus 125. The requests may comprise a logical address of the requested data, a media address of the requested data, and so on. The read pipeline 241 may be configured to read data stored in a contextual format from the non-volatile memory media 122 and to provide the data to the SML 130 and/or a storage client 116. The read pipeline 241 may be configured to determine the media address of the data using a logical address of the data and the metadata 135. Alternatively, or in addition, the SML 130 may determine the media address of the data and may include the media address in the request. The log storage module 248 may provide the media address to the non-volatile memory elements 123, and the data may stream into the read pipeline 241 via a buffer. The read pipeline 241 may comprise one or more read synchronization buffers for clock domain synchronization, as described above.

The non-volatile memory media controller 126 may further comprise a multiplexer 249 that is configured to selectively route data and/or commands to/from the write pipeline 240 and the read pipeline 241. In some embodiments, non-volatile memory media controller 126 may be configured to read data while filling a buffer of the write pipeline 240 and/or may interleave one or more storage operations on one or more banks of non-volatile memory elements 123 (not shown).

Figure 3:
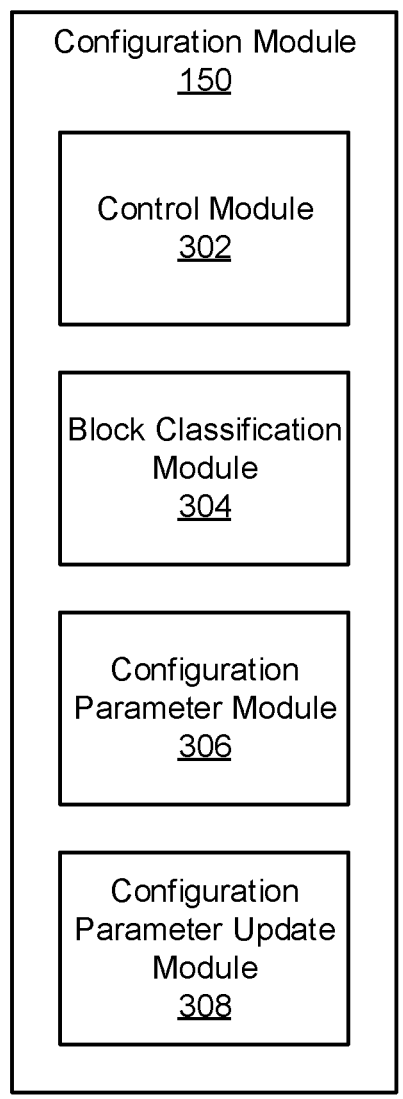
FIG. 3 is a schematic block diagram illustrating one embodiment of a configuration module.

FIG. 3 depicts one embodiment of a configuration module 150. The configuration module 150 may be substantially similar to the configuration module 150 described above with regard to FIG. 1. In general, as described above, the configuration module 150 may manage differences in one or more storage characteristics for blocks of the non-volatile memory medium 122, group the blocks based on one or more other storage characteristics, and use a configuration parameter for at least one of the groups of blocks, based on the grouping. In various embodiments, using a configuration parameter for a group of blocks may involve fewer resources than using per-block configuration parameters. In the depicted embodiment, the configuration module 150 includes a control module 302, a block classification module 304, a configuration parameter module 306, and a configuration parameter update module 308. In another embodiment, the configuration module 150 may omit the configuration parameter module 306 and/or the configuration parameter update module 308.

The control module 302, in one embodiment, is configured to manage differences in one or more storage characteristics for blocks of the non-volatile memory medium 122. In a further embodiment, the control module 302 may manage differences in storage characteristics within one or more established limits or predefined ranges. For example, in one embodiment, the control module 302 may control variation of one or more factors affecting an error rate for blocks of the non-volatile memory medium 122, by managing how and/or when the blocks are programmed, erased, or the like. In a further embodiment, the control module 302 may manage or maintain one or more of factors affecting an error rate for blocks of the non-volatile memory medium 122, such that variation of the one or more maintained factors is within a predetermined range. In certain embodiments, the control module 302 may manage variation of a program/erase count for blocks of the non-volatile memory medium 122. In certain embodiments, the control module 302 may manage variation of storage characteristics during operation of the non-volatile memory device 120.

In various embodiments, a means for managing differences in storage characteristics may include a control module 302, a configuration module 150, a non-volatile memory controller 124, a non-volatile memory media controller 126, a device driver such as an SML 130, a processor 111, other logic hardware and/or other executable code stored on a computer readable storage medium. Other embodiments may include similar or equivalent means for managing differences in storage characteristics.

As used herein when referring to blocks of a non-volatile memory medium 122, the term "block" refers to an array of storage cells that may be treated as a single unit for reading, writing, configuration, or the like. Thus, in various embodiments, a "block" may refer to a physical or logical erase block, a physical or logical page, a word line, or the like.

A "storage characteristic" of a block, as used herein, may refer to any attribute, statistic, or other descriptor associated with the block. A storage characteristic for a block may be substantially static or may be dynamic and change over time. A storage characteristic for a block, in one embodiment, may describe more than one block. For example, in certain embodiments, a storage characteristic for a block may include or relate to the non-volatile memory element 123 (e.g., chip, die, plane, package, etc.) that includes the block. In a further embodiment, the storage characteristic may include an identifier for the non-volatile memory element 123 that includes the block, or may relate to the make, model, manufacturer, product version, or the like for the non-volatile memory element 123. In another embodiment, a storage characteristic for a block describes an attribute or statistic particular to that block, such as a program/erase cycle count for the block, a read count for the block or for pages in the block, an erase dwell time between a previous erase and a previous write for the block, a retention time since a previous write for the block, an error statistic for the block, an indicator of whether the block is partially or fully programmed, or the like. A storage media characteristic, in a further embodiment, may include or relate to an environmental condition or a use of the non-volatile memory device 120 and/or of the non-volatile memory media 122, such as a temperature, a use case (e.g., a cache use case, an archival use case, a server use case, an enterprise use case, a consumer use case, etc.), or the like.

In one embodiment, a storage characteristic for a block may be a factor that affects an error rate for the block. For example, in one embodiment, a program/erase cycle count (e.g., the number of times that a block has been programmed and subsequently erased) may affect an error rate for a block of Flash memory as charge leakage increases due to wear. As another example, in another embodiment, a retention time may affect an error rate for a block of Flash memory as cells' stored voltages decrease over time. Different storage characteristics may affect error rates differently in different types of non-volatile memory media, such as Flash memory, resistive memory, and the like. However, many storage characteristics that affect error rates will be clear when considering various types of non-volatile memory media in light of this disclosure. In general, in various embodiments, using a control module 302 to control variation of various storage characteristics may reduce variations between blocks so that it becomes practical to use per-group configuration parameters instead of per-block configuration parameters.

In one embodiment, the one or more controlled or maintained factors or managed storage characteristics (e.g., factors or storage characteristics for which the control module 302 controls variation or manages differences) may include a program/erase cycle count for the blocks of the non-volatile memory medium 122. As used herein, a "program/erase cycle count" refers to an indicator of how many program/erase cycles a block has gone through. In certain embodiments, or in certain types of non-volatile media, blocks with higher program/erase counts may be more prone to wear-related errors. In various embodiments, the program/erase cycle count may be incremented at various points in the program/erase cycle. For example, in one embodiment, the program/erase cycle count for a block may be incremented when the block is erased, so that the program/erase cycle count is substantially similar to an erase count. In another embodiment, the program/erase cycle count for a block may be incremented when the first page in the block is programmed, when the block is full, or at another time in the program/erase cycle.

In one embodiment, the one or more controlled or maintained factors or managed storage characteristics may include an erase dwell time for the blocks of the non-volatile memory medium 122. As used herein, an "erase dwell time" for a block refers to an elapsed time between erasing the block and writing data to the erased block. In certain embodiments, or in certain types of non-volatile media, blocks with higher erase dwell times may be more prone to certain types of errors. In one embodiment, an established limit for managing differences in storage characteristics may be an erase dwell time threshold, and the control module 302 may manage differences by limiting an erase dwell time to satisfy the threshold. For example, in one embodiment, the threshold may be a maximum erase dwell time (e.g., five seconds), and the control module 302 may limit erase dwell times below the threshold, thus also limiting variation in erase dwell times. In various embodiments, the control module 302 may limit erase dwell time to satisfy a threshold in various ways. For example, in one embodiment, the threshold may be satisfied for a block if the erase dwell time for the block is below the threshold. In another embodiment, the control module 302 may permit minor variations above the threshold for individual blocks, and the erase dwell time threshold may be satisfied if an average erase dwell time is below the threshold. In view of this disclosure, many types of erase dwell time thresholds are clear.

In one embodiment, the control module 302 may control or manage variation of one or more factors affecting an error rate by managing differences in one or more storage characteristics within one or more established limits. In various embodiments, a limit for managing per-block differences for a storage characteristic may be established or predetermined in terms of a maximum, a minimum, a target, a range, or the like, and may refer to the storage characteristic itself, a measurement of the storage characteristic's variation over multiple blocks, or the like. The control module 302 may maintain factors that affect an error rate by limiting variation of the maintained factors within a predetermined range. For example, in one embodiment, an established limit for managing differences in a program/erase cycle count may be that the program/erase cycle count for individual blocks should not vary by more than two percent of a lifetime expected maximum program/erase cycle count. In another embodiment, an established limit for managing differences in an erase dwell time (e.g., the time between erasing and programming a block) may be that the erase dwell time should not exceed five seconds for any block. In view of this disclosure, various limits that may be established for managing differences in storage characteristics, in various embodiments, are clear. Established limits, or a range for limiting variation of a factor or storage characteristic, may be predetermined by a non-volatile memory manufacturer, a device manufacturer, a vendor, a user configuring a device (e.g., an administrator, a technician), or the like. In various embodiments, a predetermined range may be directly established as a range (e.g., in terms of endpoints of the range), or indirectly established (e.g., in terms of a target, a percentage of allowable variation, or the like).

In one embodiment, the control module 302 controls or manages variation of a storage characteristic by controlling a process that affects the storage characteristic. For example, in one embodiment, the control module 302 may manage variation of a program/erase cycle count by controlling the programming, erasing, and/or grooming processes so that blocks with low program/erase cycle counts receive additional use before blocks with high program/erase cycle counts. In another embodiment, the control module 302 may manage differences in erase dwell times by controlling erasing or grooming processes, so that blocks are erased shortly before additional data is written. In various embodiments, various ways to control variations of storage characteristics are clear in light of this disclosure.

The block classification module 304, in one embodiment, is configured to group blocks of the non-volatile memory medium 122 based on one or more storage characteristics other than the storage characteristics for which the control module 302 manages differences or controls variation. For example, in one embodiment, the block classification module 304 may group blocks of the non-volatile storage medium based on one or more additional factors affecting the error rate. In certain embodiments, the block classification module 304 may categorize the blocks into groups based on retention times.

In various embodiments, a means for grouping blocks based on storage characteristics may include a block classification module 304, a configuration module 150, a non-volatile memory controller 124, a non-volatile memory media controller 126, a device driver such as an SML 130, a processor 111, other logic hardware and/or other executable code stored on a computer readable storage medium. Other embodiments may include similar or equivalent means for grouping blocks based on storage characteristics.

As used herein, an "other" or "additional" factor or storage characteristic refers to a factor or storage characteristic other than the factors or storage characteristics for which the control module 302 controls variation or manages differences. For example, in one embodiment, the control module 302 may control variation in program/erase cycle counts and erase dwell times, and the block classification module 304 may group, classify, or categorize blocks based on other or additional storage characteristics, which may include a retention time, a die-to-die variation (e.g., a storage characteristic that varies from die to die, such as an identifier of the die, temperature of the die, or the like), a partially programmed state (e.g., an indicator of whether a block is partially or fully programmed), or the like. With the variation of certain factors controlled by the control module 302, using a block classification module 304 to group blocks based on other or additional factors allows configuration parameters to be managed on a per-group basis.

In certain embodiments, the additional factors that the block classification module 304 uses to group blocks may include a retention time for blocks of the non-volatile memory medium 120. As used herein, a "retention time" for a block may refer to an elapsed time since writing the block's contents to that block. In various embodiments a retention time may be measured or determined in various ways. For example, in one embodiment, a retention time may be a real (e.g., wall-clock) time, determined by comparing a current time to a time-stamp recorded when writing to the block. In another embodiment, a retention time may be measured in terms of time elapsed while the non-volatile memory device 120 is in use or powered on, and the retention time may be determined by a retention time counter for the block that increments while the non-volatile memory device 120 is in use or powered on. In certain embodiments, a block may include multiple pages, and data may be written to different pages at different times, so a retention time for the block may include a minimum retention time, maximum retention time, average retention time, or the like, for the pages in the block.

As used herein, "grouping" the blocks, in various embodiments, may refer to associating various blocks with various groups, or otherwise classifying or categorizing the blocks into groups. For example, in one embodiment, the block classification module 304 may group blocks by recording a group number (or other group identifier) in a header or footer for each block. In another embodiment, the block classification module 304 may group blocks by storing a table that records which blocks belong to which groups. In certain embodiments, the block classification module 304 may group blocks by defining values for the other or additional storage characteristics that the groups are based on. For example, in one embodiment, the block classification module 304 may assign different ranges of retention times to different groups, and the configuration module 150 may treat each block with a retention time in a group's range as a member of that group, without the block classification module 304 explicitly recording which blocks belong to the group. Thus, in various embodiments, the block classification module 304 may "group" the blocks by establishing a set of groups based on additional or other storage characteristics, explicitly recording blocks' membership in the groups, informing another module of the configuration module 150 what group a block belongs to (or how the groups are defined) without explicitly recording what blocks belong to what groups, reassigning a block to a different group based on a change in the additional or other storage characteristics, or the like. In view of this disclosure, many ways of grouping blocks are clear.

In one embodiment, the block classification module 304 may group the blocks based on retention times for the blocks, as described above. In a further embodiment, the blocks may be grouped using larger ranges of retention times for groups associated with larger retention times. For example, in one embodiment, one group associated with a short retention time may include blocks with a retention time between 1 and 2 hours (a 1 hour range), and another group associated with a longer retention time may include blocks with a retention time between 16 and 32 hours (a 16 hour range). In general, grouping blocks based on a range (e.g., a range of retention times) may allow a per-group configuration parameter to be used for blocks that vary within the range. Thus, in certain embodiments, using a range for grouping the blocks may facilitate a less complicated (e.g., per-group rather than per-block) configuration parameter scheme by defining a floor for the level of granularity, or an acceptable amount of variation for blocks using the same configuration parameter.

In some embodiments, the size of a range for grouping the blocks based on an additional storage characteristic may be based on a sensitivity of an error rate to changes in that storage characteristic. For example, in one embodiment, an error rate for a block may be sensitive to small changes in retention time when retention times are low. For example, an error rate for a block with a retention time of one hour may change significantly after an additional hour of retention time. However, in a further embodiment, an error rate for a block may only change significantly with large changes in retention time when retention times are high. For example, an error rate for a block with a retention time of one month may not change significantly after an additional hour of retention time, but may change significantly after an additional month. Thus, in various embodiments, changing the size of ranges that define the groups may allow larger variations for blocks within a group, and larger groups for per-group configuration parameters, when error rates are less sensitive to the larger variations.

In one embodiment, grouping blocks using larger ranges of retention times for groups associated with larger retention times may involve similarly-sized retention time ranges for some groups, but may involve at least one larger retention time range for at least one group associated with a larger retention time. In certain embodiments, ranges of retention times for different groups may be based on logarithms of retention times. For example, in one embodiment, retention time boundaries between different groups may be uniformly spaced on a logarithmic scale (e.g., each retention time boundary may be a fixed multiple of the previous boundary).

The configuration parameter module 306, in one embodiment, is configured to use a configuration parameter for at least one of the groups of blocks based on the grouping. In one embodiment, the configuration parameter module 306 may configure different groups to use different read voltage thresholds based on retention times. In various embodiments, a means for using a configuration parameter may include a configuration parameter module 306, a configuration module 150, a non-volatile memory controller 124, a non-volatile memory media controller 126, a device driver such as an SML 130, a processor 111, an interface provided by the non-volatile memory media 122, other logic hardware and/or other executable code stored on a computer readable storage medium. Other embodiments may include similar or equivalent means for using a configuration parameter.

As used herein, a "configuration parameter" for a block or a group of blocks refers to any parameter that is configurable or modifiable by way of an interface. The interface may comprise a publicly known interface or a proprietary interface and may include use of particular command instructions and/or use of particular parameters, register settings, driver settings, controller settings, a particular set of command instruction sequences, or other differences from regular commands (general purpose commands) or settings used to interface with or manage the non-volatile memory media 122. Configuration parameters may relate to writing to, or programming, storage cells in blocks, reading from storage cells, erasing storage cells, managing storage cells, device driver or storage controller settings for storage cells, or the like. A configuration parameter for a block or a group of blocks may be associated with a device driver for the non-volatile memory device 120, a non-volatile memory controller 124, a driver or SML 130, a non-volatile memory media controller 126, or the like, and may relate to how the device driver and/or controller use, manage, and interact with the block or group of blocks and/or the non-volatile memory media 122.

A configuration parameter, in certain embodiments, may refer to a threshold or a set of thresholds. In certain embodiments, various read thresholds for the data-encoding physical property of a storage cell may divide the range of possible stored values into states (e.g., the threshold values may be boundaries between discrete values stored by the storage cells). For example, in one embodiment, read voltage thresholds may divide a range of possible stored voltages into discrete states for Flash memory cells. In another embodiment, read resistance or resistivity thresholds may divide a range of possible stored resistances or resistivities into discrete states for resistive memory cells. In a further embodiment, write thresholds such as program verify thresholds or erase verify thresholds may establish guard bands near the boundaries between states (e.g., read thresholds), and the write process for a storage cell may include verifying that a cell does not store a value in the guard band between a read threshold and a write threshold. In various embodiments, configuring or reconfiguring read thresholds may avoid errors that might otherwise occur as the stored value for a memory cell drifts over time. Similarly, in further embodiments, configuring or reconfiguring write thresholds may allow guard bands to shift with the read thresholds, or may change the size of guard bands (e.g., if larger guard bands become more useful as the non-volatile memory medium 122 ages)

In a further embodiment, a configuration parameter may refer to a another configurable or modifiable parameter, such as a threshold or parameter pertaining to a driver, a threshold or parameter pertaining to a hardware controller, such as an incremental step pulse programming parameter, or the like. In view of this disclosure, many types of configuration parameter are clear. The configuration parameter may be set once during initialization of the non-volatile memory media 122, dynamically with each command issued to the non-volatile memory media 122, or during operation of the non-volatile memory media 122 in response to triggers such as events or time intervals. The non-volatile memory controller 124, in one embodiment, proactively sets one or more configuration parameters for groups of blocks to improve the utility of the non-volatile memory media 122, to reduce errors, and the like.

In one embodiment, the configuration parameter module 306 may use a configuration parameter for a group of blocks based on the grouping by setting or storing the configuration parameter for the group, or for each block in the group. For example, in one embodiment, the non-volatile memory medium 122 may include registers that store read thresholds (e.g., read voltage thresholds), and the configuration parameter module 306 may use a configuration parameter for a group of blocks by setting or storing threshold values in the registers corresponding to blocks in the group. In another embodiment, the configuration parameter module 306 may use a configuration parameter based on a grouping by storing a table (or other data structure) with a set of configuration parameters for each group, so that the table is referenced when blocks in a group are accessed. In another embodiment, the configuration parameter module 306 may use a configuration parameter for a group of blocks dynamically by providing the configuration parameter (e.g., to the block access module 402 of FIG. 4) when a block in the group is accessed.

In one embodiment, the configuration parameter module 306 may store a single set of one or more configuration parameters per group such that the single set of configuration parameters for a group is used for blocks of the group. For example, in one embodiment, the single set of one or more configuration parameters for a group may include a single read threshold, an offset affecting multiple read thresholds, or the like. In certain embodiments, the configuration parameter module 306 may store, for each group, a set of one or more threshold values for boundaries between discrete values stored by storage cells of the non-volatile storage medium 122. In a further embodiment, read thresholds may be set according to the single set of configuration parameters for a group, when accessing blocks in that group. In certain embodiments, storing a single set of configuration parameters per group may reduce memory overhead that would otherwise be used to store per-block configuration parameters.

As a further example, in certain embodiments, where the block classification module 304 categorizes blocks into groups based on retention times, the configuration parameter module 306 may configure different groups to use different read thresholds based on the retention times. In a further embodiment, the configuration parameter module 306 may store a single read threshold, an offset, a set of one or more read thresholds, or the like, for each group of blocks.

In one embodiment, the configuration parameter module 306 may determine a granularity (e.g., a level of precision) for storing configuration parameters for the groups, and may store configuration parameters at the determined granularity. For example, in one embodiment, the configuration parameter module 306 may determine to store configuration parameters at a high granularity or level of precision, so as to have finer control over configuration parameters for each group. In another embodiment, however, configuration parameters for two similar groups may be sufficiently similar so that one configuration parameter would work well for both groups, and the configuration parameter module 306 may determine to store configuration parameters at a low granularity or level of precision, to avoid switching configuration parameters when accessing blocks from both groups.

The configuration parameter update module 308, in one embodiment, is configured to update a configuration parameter. In various embodiments, a means for updating a configuration parameter may include a configuration parameter update module 308, a configuration module 150, a non-volatile memory controller 124, a non-volatile memory media controller 126, a device driver such as an SML 130, a processor 111, an interface provided by the non-volatile memory media 122, other logic hardware and/or other executable code stored on a computer readable storage medium. Other embodiments may include similar or equivalent means for updating a configuration parameter.

In one embodiment, the configuration parameter update module 308 may update a configuration parameter for a block in response to the block classification module 304 reclassifying or regrouping the block based on a change in one or more of the additional factors (e.g., the factors that groupings are based on as described above). For example, in one embodiment, the retention time for a block may change as the block ages, resulting in the block classification module 304 regrouping the block into a higher retention time group. In a further embodiment, the configuration parameter update module 308 may update the configuration parameter (e.g., read threshold) for that block based on the block's new group. In another embodiment, however, configuration parameters may be set on a per-group basis and referenced when blocks are accessed, in which case a configuration parameter for a block may be updated simply by the block classification module 304 regrouping the block, without the configuration parameter update module 308 specifically setting the updated configuration parameter for that block.

In certain embodiments, the configuration parameter update module 308 may update a configuration parameter or determine a new configuration parameter for at least one of the groups of blocks in response to a change in the one or more controlled or maintained factors, or managed storage characteristics (e.g., factors or storage characteristics for which the control module 302 controls variation or manages differences). For example, in one embodiment, the control module 302 may manage variation of factors such as a program/erase count or erase dwell time for the blocks, so that reduced variation among the blocks makes it practical to apply per-group configuration parameters (e.g., read voltage thresholds) for groups based on retention time. However, although the reduced variation in block program/erase counts may make grouping practical, increasing program/erase counts over time are associated with wear, which may increase charge leakage, making different configuration parameters more practical. Thus in one embodiment, the configuration parameter update module 308 may determine new configuration parameters for the groups in response to a change in a controlled factor, such as an increase in a program/erase count. In a further embodiment, the configuration parameter update module 308 may update a read voltage threshold for at least one of the groups in response to a change in the program/erase count.

In one embodiment, a change in a controlled factor that triggers the configuration parameter update module 308 to determine a new configuration parameter may include a program/erase cycle count satisfying a threshold. In various embodiments, it may be impractical to update or redetermine read thresholds with every increase in program/erase cycle count, so the configuration parameter update module 308 may use thresholds to determine when to update configuration parameters for the groups. In various embodiments, program/erase cycle count thresholds may be satisfied in different ways. For example, in one embodiment, a program/erase cycle count threshold may be satisfied by an increase of 10, 50, or 100 cycle counts, an increase of 1% of maximum expected program/erase cycles or the like. In another embodiment, program/erase cycle counts may be uniformly spaced on a logarithmic scale, so that each subsequent program/erase cycle count threshold is satisfied when the average program/erase cycle count passes a fixed multiple of the previous threshold. In view of this disclosure, various types of thresholds and ways of satisfying thresholds will be clear for various types of controlled factors such as program/erase cycle counts or the like, in various embodiments.

In various embodiments, the configuration parameter update module 308 may select an updated configuration parameter or determine a new configuration parameter in various ways. Certain methods of updating a configuration parameter or determining a new configuration parameter are discussed further below with regard to the block sample module 410 and parameter selection module 412 of FIG. 4.

Figure 4:
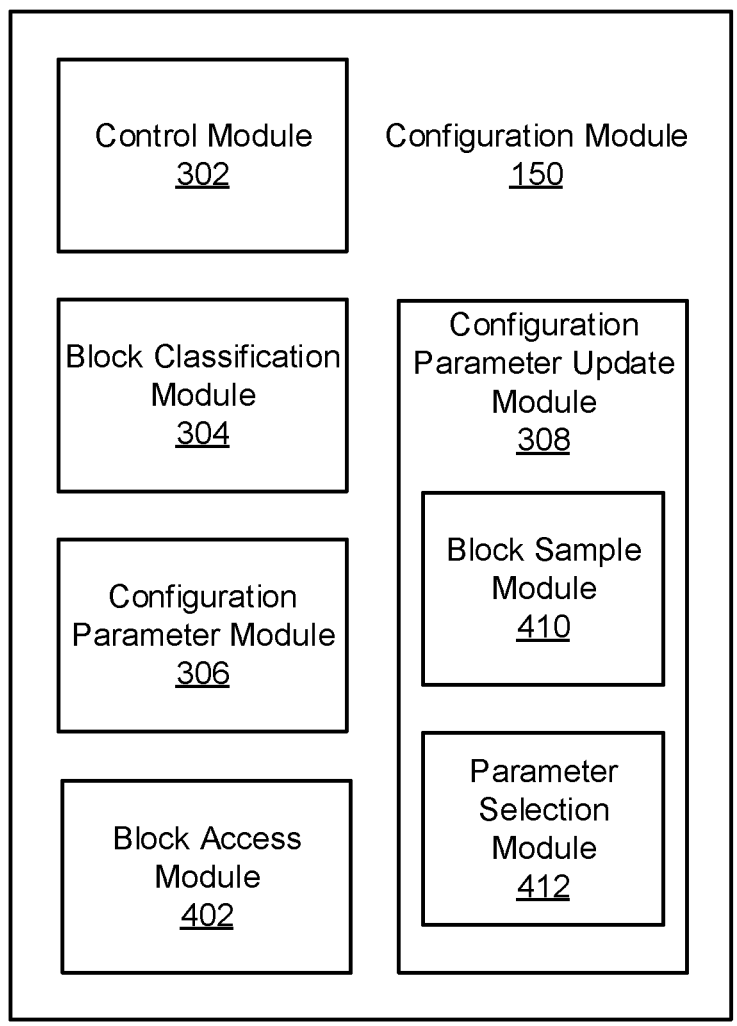
FIG. 4 is a schematic block diagram illustrating another embodiment of a configuration module.

FIG. 4 depicts another embodiment of a configuration module 150. The configuration module 150, in certain embodiments, may be substantially similar to the configuration module 150 described above with regard to FIG. 1, FIG. 2, and/or FIG. 3. In the depicted embodiment, the configuration module 150 includes a control module 302, a block classification module 304, a configuration parameter module 306, and a configuration parameter update module 308, which may be configured substantially as described above with regard to FIG. 3. The configuration module 150, in the depicted embodiment, includes a block access module 402. The configuration parameter update module 308, in the depicted embodiment, includes a block sample module 410 and a parameter selection module 412.

The block access module 402, in one embodiment, is configured to access blocks using a configuration parameter from the configuration parameter module 306. For example, in one embodiment, the configuration parameter module 306 may use a configuration parameter that includes a set of read thresholds for a group of blocks, and the block access module 402 may read data from a block in the group using the set of read thresholds for the group. In another embodiment, the configuration parameter module 306 may use a configuration parameter that includes a set of program verify thresholds for a group of blocks, and the block access module 402 may write data to a block in the group using the set of program verify thresholds for the group. In various embodiments, various ways of accessing blocks using a configuration parameter are clear.

In certain embodiments, the block access module 402 may access partially programmed blocks and fully programmed blocks using different configuration parameters. For example, in one embodiment, the "other" storage characteristics (e.g., storage characteristics for which the control module 302 does not manage variation) may include a partially programmed state for one or more of the blocks. In certain embodiments, a partially programmed state may refer to any indicator of whether a block is partially or fully programmed, such as a footer for the block, the last page of the block, an indicator that tracks the position of an append point in the block, or the like. In a further embodiment, the block classification module 304 may group blocks based on their partially or fully programmed state instead of or in addition to other storage characteristics such as retention time, and the configuration parameter module 306 may use configuration parameters based on that grouping.

Thus, in one embodiment, the block access module 402 may be configured to use a first configuration parameter to access a fully programmed block, and to use a second configuration parameter, different from the first configuration parameter, to access a partially programmed block. For example, in certain embodiments, blocks may be grouped by both retention time and partially programmed state, and the configuration parameter module 306 may store a first table of configuration parameters (e.g., sets of read thresholds) for groups of fully-programmed blocks associated with different retention times, and may store a second table of configuration parameters for groups of partially programmed blocks associated with different retention times. In some embodiments, using different configuration parameters for partially programmed blocks and fully programmed blocks allows the configuration parameters for the partially programmed blocks to account for disturb phenomena that may occur when programming remaining pages in the blocks.

In one embodiment, the configuration parameter update module 308 uses the block sample module 410, block access module 402, and parameter selection module 412 to determine a new configuration parameter for a group (e.g., in response to an change in the program/erase cycle count or other controlled factors) in an closed loop approach. In another embodiment, the configuration parameter update module 308 uses the parameter selection module 412 without the block sample module 410 and block access module 402 to select a new configuration parameter for a group in an open loop approach.

In one embodiment, in a closed loop approach, the configuration parameter update module 308 determines a new configuration parameter for a group of blocks by using the block sample module 410 to sample one or more blocks from the group, cooperating with the block access module 402 to access the sampled blocks multiple times with different values for the new configuration parameter, and using the parameter selection module 412 to select a value from the different values for the new configuration parameter based on an error characteristic for the sampled blocks.

In the closed loop approach, in one embodiment, the block sample module 410 samples one or more blocks from a group of blocks. As used herein, "sampling" blocks from a group of blocks refers to selecting a number of blocks from the group. In one embodiment, the block sample module 410 may select all the blocks from the group, so that the configuration parameter update module 308 determines a new configuration parameter based on every block in the group. However, in another embodiment, the block sample module 410 may select a smaller number of blocks as a representative sample of the group, to decrease the time it takes for the configuration parameter update module 308 to determine a new configuration parameter for the group based on the sampled blocks.

In one embodiment, the block sample module 410 may randomly select any blocks in the group. In another embodiment, the block sample module 410 may divide the group into subgroups for blocks on different chips, die, planes, packages, or the like, and may randomly select a number of blocks from each subgroup. In view of this disclosure, various ways of sampling blocks to obtain a reasonably representative sample are clear, for various embodiments In the closed loop approach, in a further embodiment, the block access module 402 may access or attempt to access the sampled blocks from the block sample module 410 multiple times, with different values for the new configuration parameter. In certain embodiments, accessing the sampled blocks multiple times with different configuration parameter values may allow the configuration parameter update module 308 to determine a new configuration parameter by trial and error. In one embodiment, the block access module 402 may access a block multiple times with different configuration parameters by sending multiple commands to the block. For example, in certain embodiments, the block access module 402 may read data from a block five times with five different read thresholds by issuing five separate read commands with different thresholds. In another embodiment, the block access module 402 may access a block multiple times with different configuration parameters by sending a single command to the block. For example, in one embodiment, a single "soft read" command may return results from reading a block several times with different read thresholds.

In the closed loop approach, in certain embodiments, the parameter selection module 412 selects a value from the different values for the new configuration parameter used by the block access module 402 to access the sampled blocks. In a further embodiment, the configuration parameter update module 308 may use the selected value as the new configuration parameter for the group. In one embodiment, the parameter selection module 412 may select the value based on an error characteristic for the sampled blocks. As used herein, an "error characteristic" for a block may refer to any characteristic relating to or describing errors that occur when accessing or attempting to access the block. In various embodiments, an error characteristic may include a raw bit error rate (RBER), an uncorrectable bit error rate (UBER) a number of errors changing zeros to ones, a number of errors changing ones to zeros, or any other characteristic relating to errors.

Thus, in one embodiment, the parameter selection module 412 may select the new configuration parameter based on an error characteristic by selecting the configuration parameter value resulting in the lowest RBER or UBER when attempting to access the sampled blocks. In another embodiment, if a "whitening" algorithm encodes data using an equal number of ones and zeros, the parameter selection module 412 may select the new configuration parameter based on an error characteristic by selecting the configuration parameter value that most nearly equalizes the number of errors changing zeros to ones and the number of errors changing ones to zeros. In general, in various embodiments, selecting the new configuration parameter value based on an error characteristic for the sampled blocks may reduce errors when accessing blocks of the group using the new configuration parameter. Further ways of selecting a new configuration parameter value based on an error characteristic are clear in view of this disclosure.

In another embodiment, in an open loop approach, the configuration parameter update module 308 may use the parameter selection module 412 to select a new configuration parameter without using the block sample module 410 or the block access module 402 to access, or attempt to access a group of sampled blocks. Instead, in the open loop approach, the parameter selection module 412 may select the new configuration parameter for a group of blocks from a set of predetermined configuration parameters based on the grouping. In certain embodiments, configuration parameters based on a grouping may be predetermined by modeling or characterizing blocks with similar storage characteristics to the group. In one embodiment, predetermined configuration parameters may be based on a mathematical model of expected characteristics for a group of blocks. In another embodiment, predetermined configuration parameters may be based on experimental characterization of a similar group of blocks in a different non-volatile storage device. In some embodiments, a set of predetermined configuration parameters may include different configuration parameter values for groups with different storage characteristics. In view of this disclosure, many ways of predetermining various configuration parameters are clear.

In general, in various embodiments, using the parameter selection module 412 to select a configuration parameter value from a set of predetermined values in an open loop approach may allow the configuration parameter update module 308 to determine a new configuration parameter while avoiding delays associated with accessing sampled blocks multiple times in a closed loop approach. However, in certain embodiments, using configuration parameters determined for a particular group of blocks in a closed loop approach may be better (e.g., may result in fewer errors) than using predetermined configuration parameters in an open loop approach.

Figure 5A:
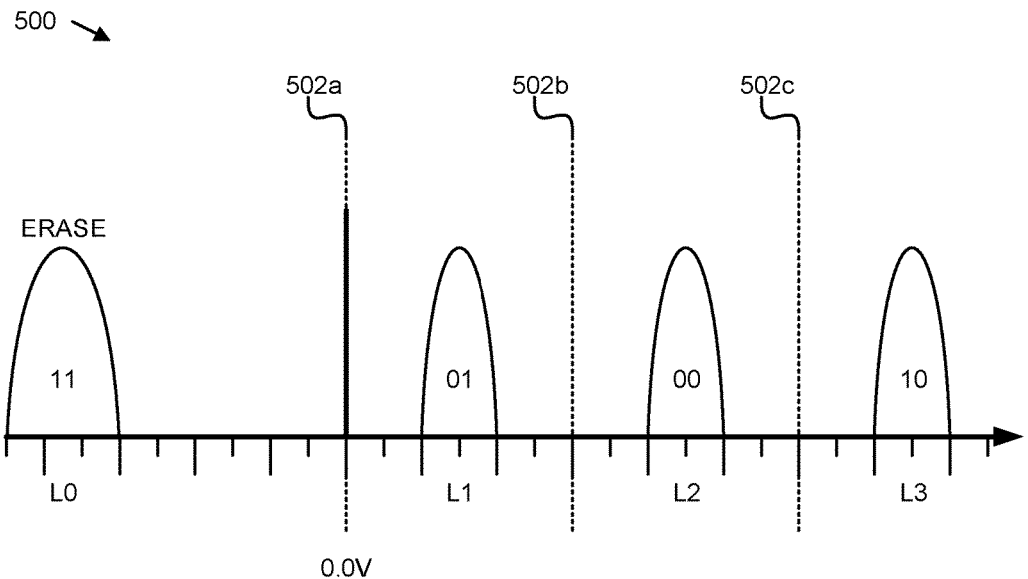
FIG. 5A is a graph illustrating one embodiment of configuration parameters for a non-volatile storage medium.

FIG. 5A depicts a graph 500 of a distribution of stored voltage values for cells of a non-volatile memory medium 122 using configuration parameters 502a-c. In the depicted embodiment, the non-volatile memory medium 122 is a multi-level cell (MLC) Flash memory medium in which each cell is a floating gate transistor with four states, but various types of memory and numbers of states per cell may be used in other embodiments. In the depicted embodiment, the data-encoding physical value of each cell is a voltage stored by the cell. Data is stored in each cell by changing the amount of stored charge in the floating gate, which determines the stored voltage for the cell and within which abode or state (e.g., the depicted L0, L1, L2, and L3 abodes) the stored voltage falls.

In the depicted embodiment, configuration parameters 502a-c are read thresholds (e.g., read voltage thresholds) that divide the range of possible stored voltage values for a cell into states L0, L1, L2, and L3, where L0 is the erased state. A read voltage corresponding to one of the read voltage thresholds 502a-c is applied to the control gate of the cell, and if the applied read voltage is sufficient to make the channel of the floating gate transistor conductive, the stored voltage for the cell is above the corresponding read voltage threshold 502a-c. If the stored voltage for a cell is below the first read threshold 502a, the cell is in the L0 state. If the stored voltage for a cell is above the first read threshold 502a but below the second read threshold 502b, the cell is in the L1 state, and so on. In some embodiments, the erased state L0 may correspond to a negative stored voltage.

In one embodiment, an encoding maps states onto data values. For example, in the depicted embodiment, a Gray code encoding maps the four states L0, L1, L2, and L3 to the data values "11," "01," "00," and "10," respectively, so that the cell stores two bits of information. Cells of non-volatile memory media may store data using many other encodings.

The graph 500 depicts the distribution of stored voltages for a set of cells, representing the number of cells storing each possible stored voltage occurring for the set of cells, a random selection from the set of cells, or the like. The graph 500 depicts an approximately uniform distribution among states L0-L3. In practice, the distribution of states for a set of cells may not be uniform. For example, if a long string of zeroes is written to a set of cells, more cells may be in the L2 state, which encodes "00" than in the other states. However, data compression or whitening algorithms may make the distribution of states substantially uniform over a large set of cells.

Although the distribution may be substantially uniform among states L0-L3, it is depicted as forming a peak in each state. In some embodiments, a cell may be programmed by issuing voltage pulses that move a stored voltage level for the cell to or near a target voltage in the middle of the range of voltages that defines the state. In a further embodiment, the target voltage for a state may be another configuration parameter for a block or non-volatile memory media 122. A peak may be centered on the target programming voltage, or the like. The width of the peaks may be affected by variations in the cells and the programming process, or by error-causing phenomena such as read disturbs, program disturbs, stress-induced leakage current, or the like. Although symmetric peaks are shown, skewed distributions and other distributions are possible. Over time, the distributions may widen or skew as the stored voltages move from their originally programmed values.

Figure 5B:
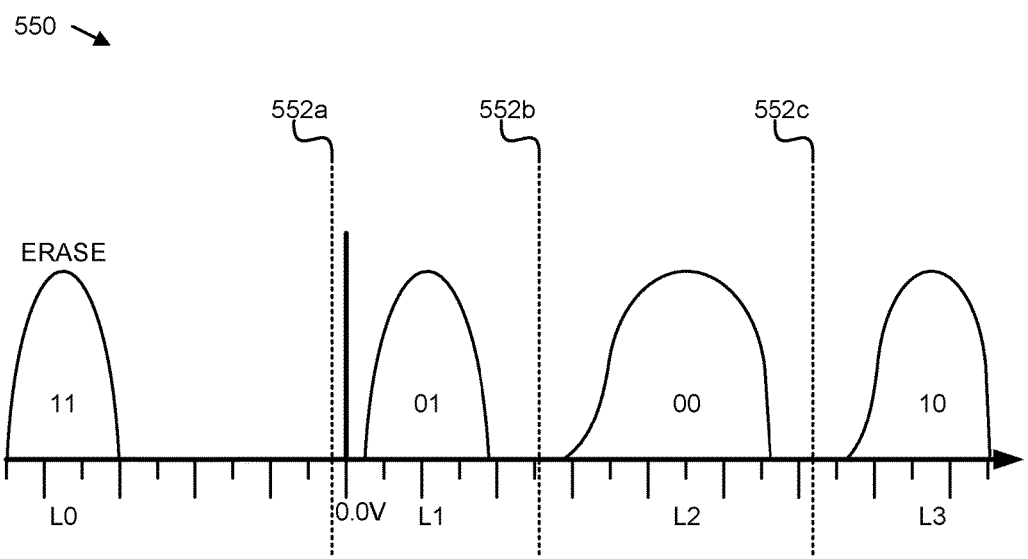
FIG. 5B is a graph illustrating another embodiment of configuration parameters for a non-volatile storage medium.

FIG. 5B depicts a graph 550 of another distribution of stored voltage values for the same set of cells as FIG. 5A, with adjusted configuration parameters 552a-c. The same states L0, L1, L2, and L3 encode the same data values data values "11," "01,""00," and "10," respectively, as described above. However, the peaks are wider in FIG. 5B than in FIG. 5A, and may be skewed. The widened and/or skewed peaks may be a result of error-causing phenomena such as read disturbs, program disturbs, stress-induced leakage current, or the like. As the peaks' shapes change with retention time, program/erase count, or other changes in storage characteristic, there is a substantial likelihood that a cell's stored voltage may cross one of the read thresholds 502 of Figure A, which would change that cell's state, resulting in an error, if the configuration module 150 did not manage configuration parameters by using adjusted read thresholds 552.

In certain embodiments, the configuration parameters 502a-c of FIG. 5A are default configuration parameters, set by a manufacturer, a vendor, or the like and the configuration module 150 may adjust or configure the default configuration parameters 502a-c to the adjusted configuration parameters 552a-c. The adjusted configuration parameters 552a-c more closely match the actual distributions of storage cell states of FIG. 5B than do the default configuration parameters 502a-c. Were a corresponding set of storage cells to use the default configuration parameters 502a-c with the distributions of storage cell states of FIG. 5B, the portions of the distributions that have drifted past the locations of the default configuration parameters 502a-c would register data errors. By configuring the corresponding set of storage cells to use the adjusted configuration parameters 552a-c, the configuration module 150 prevents, avoids, or corrects the potential data errors.

In some types of non-volatile media, the distribution of stored voltages (or other data-encoding physical properties) may change differently for each block of storage cells, due to each block having different storage characteristics. For example, in one embodiment, some blocks used for long-term data storage may have low program/erase counts and high retention times, while other blocks used for short-term data caching may have high program-erase cycle counts and low retention times. In a further embodiment, the different program/erase counts and retention times may shift the distribution of stored voltages in different ways, so that different adjusted configuration parameters 552a-c are used for each block. However, by managing variation of one or more storage characteristics, the control module 302 makes it more likely that the distribution of stored voltages may shift in similar ways for groups of blocks. For example, if the control module 302 manages variations in program/erase cycle count, then a single set of adjusted configuration parameters 552a-c may be used for a group of blocks with similar retention times.

FIG. 6A depicts one embodiment of a table 600 of groups 602 for blocks of a non-volatile storage medium 122. In various embodiments, the block classification module 304 may group blocks based on one or more "other" storage characteristics (e.g., storage characteristics other than those for which the control module 302 manages differences), such as retention time 604 or the like; the table 600 depicts retention times 604 for the different groups 602. In the depicted embodiment, each group 602 is numbered for convenience in referring to the different groups 602. However, in a further embodiment, the block classification module 304 may group blocks without numbering the groups.

In the depicted embodiment, each group 602 is associated with a range of retention times 604. The table 600 depicts an upper bound for the retention time 604 of each group 602, in hours, except for the thirteenth group 602, which is associated with the highest range of retention times 604, without an upper bound. The lower bound for the range of retention times 604 is zero for the first group 602, and is the upper bound of the previous range for subsequent groups 602. Thus, the first group 602 includes blocks with a retention time 604 from zero to one hours, the second group 602 includes blocks with a retention time 604 from one to two hours, and so on, so that the thirteenth group 602 includes blocks with a retention time 604 greater than 2160 hours.

In the depicted embodiment, groups 602 associated with larger retention times 604 also have larger ranges of retention times. For example, a newly-written block may only be in the first group 602 for one hour, but a block with a higher retention time 604 may be in the eleventh group 602 for approximately one month. In certain embodiments, grouping blocks based on larger retention time ranges for groups 602 associated with larger retention times may allow the groups to reflect that small changes in retention time 604 are more significant (e.g., more likely to cause errors) for small retention times 604. The depicted retention times 604 are an example for the depicted embodiment; in another embodiment, blocks may be grouped based on different ranges of retention times, or based on different storage characteristics.

FIG. 6B depicts another embodiment of a table 650 of groups 652 for blocks of a non-volatile storage medium 122. As in table 600 of FIG. 6A, table 650 numbers groups 652 for convenience, and depicts a retention time 656, 658, 660 for each group 652 that represents one of the endpoints for a range of retention times. For convenience, each retention time 656, 658, 660 is shown in seconds 656, hours 658, and days 660. Also as in table 600 of FIG. 6A, table 650 shows larger ranges of retention times 656, 658, 660 for groups 652 associated with larger retention times 656, 658, 660.

In the depicted embodiment, the maximum retention times 656, 658, 660 for each group 652 (other than the last group 656, 658, 660, with no maximum) are uniformly spaced on a logarithmic scale. Or, in other words, each maximum retention time 656, 658, 660 is a fixed multiple of the maximum retention time 656, 658, 660 for the previous group 652. In the depicted embodiment, each successive group 652 is associated with a successive exponent for a power of two 654, and the retention time in seconds 656 is two raised to that exponent 654. Thus, the exponent 654 for the first group 652 is 12, and the maximum retention time in seconds 656 for that group 652 is 2^12, or 4096. Similarly, the exponent 654 for the second group 652 is 13, and the maximum retention time in seconds 656 for that group 652 is 2^13, or 8192, and so on.

In certain embodiments, groups 652 based on retention time ranges (in seconds) corresponding to powers of two may provide larger retention time ranges for groups 652 having larger retention times 656, 658, 660, as discussed above. Furthermore, in certain embodiments, a block's retention time may be represented in binary as a number of seconds, so that if the groups 652 are based on powers of two 654, the group for the block may be identified based on the position of the most significant nonzero bit in the binary representation of the retention time.

Figure 7:
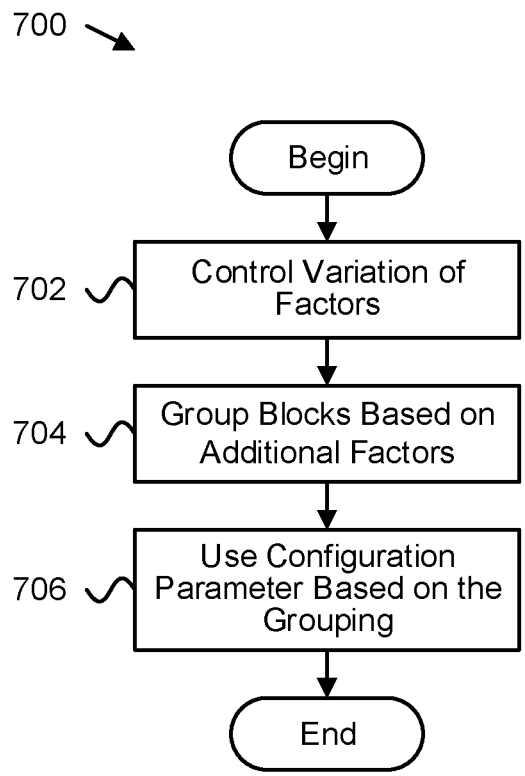
FIG. 7 is a schematic flow chart diagram illustrating one embodiment of a method for managing configuration parameters.

FIG. 7 depicts one embodiment of a method 700 for managing configuration parameters. The method 700 begins, and the control module 302 controls 702 variation of one or more factors affecting an error rate for blocks of a non-volatile storage medium 122. The block classification module 304 groups 704 the blocks based on additional factors affecting the error rate. The configuration parameter module 306 uses 706 a configuration parameter based on the grouping, and the method 700 ends.

Figure 8:
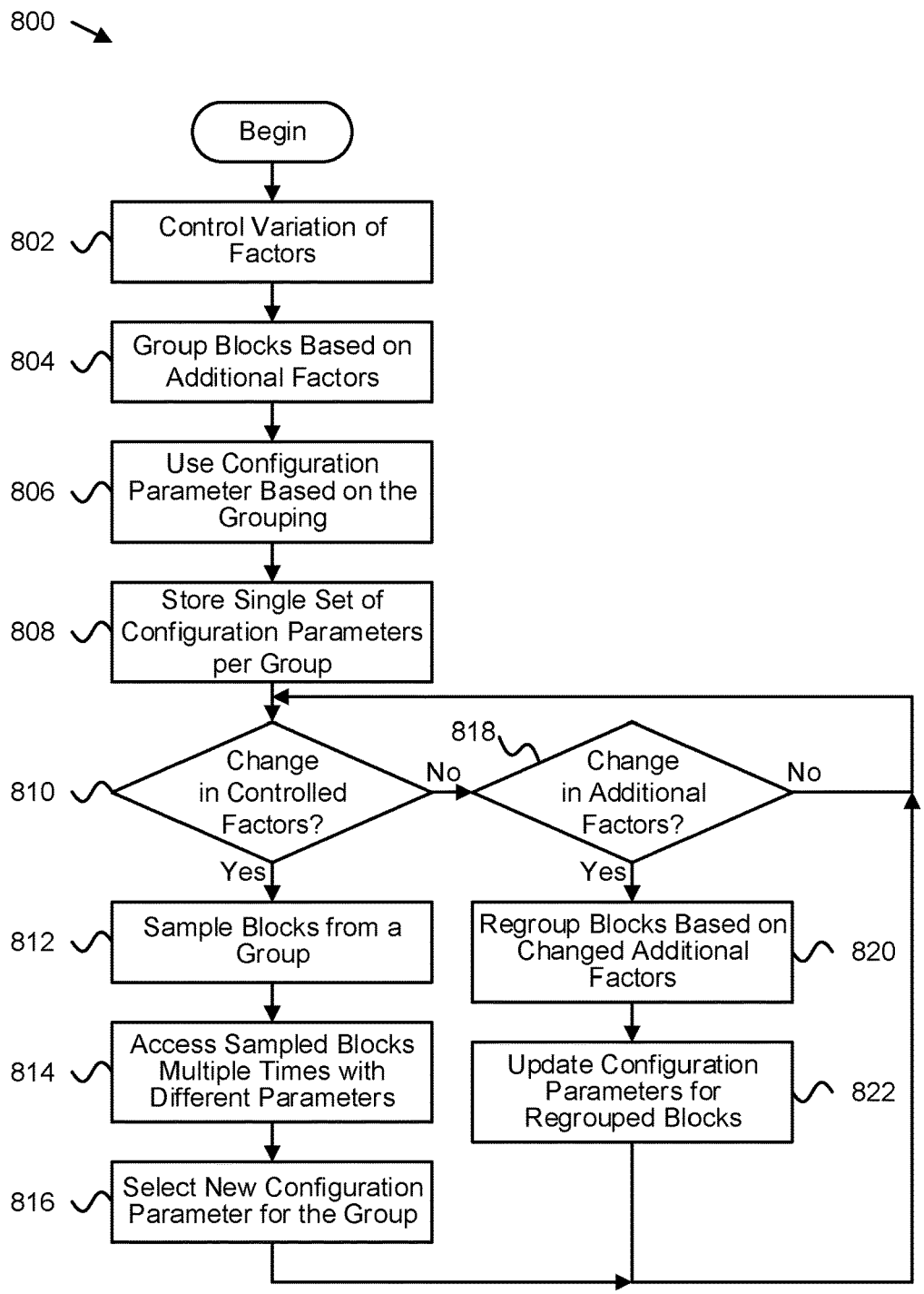
FIG. 8 is a schematic flow chart diagram illustrating a further embodiment of a method for managing configuration parameters.

FIG. 8 depicts another embodiment of a method 800 for managing configuration parameters. The method 800 begins, and the control module 302 controls 802 variation of one or more factors affecting an error rate for blocks of a non-volatile storage medium 122. The block classification module 304 groups 804 the blocks based on additional factors affecting the error rate. The configuration parameter module 306 uses 806 a configuration parameter based on the grouping. The configuration parameter module 306 stores 808 a single set of configuration parameters per group. The configuration parameter update module 308 determines 810 whether a change in the controlled factors has occurred. If a change in the controlled factors has occurred (e.g., a change satisfies a threshold), the block sample module 410 samples 812 blocks from a group. The block access module 402 accesses 814 the sampled blocks multiple times with different configuration parameters, and the parameter selection module 412 selects 816 a new configuration parameter for the group based on an error characteristic for the sampled blocks. The configuration parameter update module 308 continues to monitor changes in various factors, and the method 800 continues.

If a change in the controlled factors has not occurred, the configuration parameter update module 308 determines 818 whether a change in any additional factors has occurred. If not, the configuration parameter update module 308 continues to monitor changes in various factors, and the method 800 continues. If a change in any additional factors has occurred, the block classification module 304 may regroup 820 blocks based on the changed additional factors, and the configuration parameter update module 308 may update 822 configuration parameters for the regrouped blocks. The configuration parameter update module 308 continues to monitor changes in various factors, and the method 800 continues.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
   programming and erasing blocks of a non-volatile storage medium such that variation of an erase dwell time for the blocks remains within a predetermined range;
   grouping the blocks of the non-volatile storage medium based on retention times for the blocks; and
   accessing at least one of the groups of blocks using a configuration parameter selected based on the grouping.

2. The method of claim 1, further comprising storing a single set of one or more configuration parameters per group such that the single set for a group is used for blocks of the group.

3. The method of claim 1, wherein the blocks are grouped using larger ranges of retention times for groups associated with larger retention times.

4. The method of claim 1, further comprising controlling variation for a program/erase cycle count for the blocks of the non-volatile storage medium.

5. The method of claim 1, wherein the erase dwell time comprises an elapsed time between erasing one of the blocks and writing data to the erased block.

6. The method of claim 1, wherein grouping the blocks is further based on one or more of one or more of die-to-die variation and a partially programmed state for one or more of the blocks of the non-volatile storage medium.

7. The method of claim 1, further comprising storing, for each group, a set of one or more threshold values for boundaries between discrete values stored by storage cells of the non-volatile storage medium.

8. The method of claim 1, further comprising updating the configuration parameter for a block in response to regrouping the block based on a change in a retention time for the block.

9. The method of claim 1, further comprising determining a new configuration parameter for at least one of the groups of blocks in response to a change in a program/erase cycle count.

10. The method of claim 9, wherein determining the new configuration parameter for one of the groups of blocks comprises:
    sampling one or more blocks from the group;
    accessing the sampled blocks multiple times with different values for the new configuration parameter; and
    selecting a value from the different values for the new configuration parameter based on an error characteristic for the sampled blocks.

11. The method of claim 9, wherein determining the new configuration parameter for one of the groups of blocks comprises selecting the new configuration parameter from a set of predetermined configuration parameters based on the grouping.

12. The method of claim 9, wherein the change in the program/erase cycle count comprises the program/erase cycle count satisfying a threshold.

13. An apparatus comprising:
    a control module configured to limit erase dwell times for blocks of a non-volatile memory medium to satisfy a threshold;
    a block classification module configured to group blocks of a non-volatile memory medium based on retention times for the blocks; and
    a block access module configured to access the at least one group of blocks using a read voltage threshold selected based on the grouping.

14. The apparatus of claim 13, further comprising a configuration parameter module configured to store a single set of one or more read voltage thresholds per group such that the single set for a group is used for blocks of the group.

15. The apparatus of claim 13, wherein an erase dwell time comprises an elapsed time between erasing a block and writing data to the block.

16. The apparatus of claim 13, wherein the block access module is configured to use a first read voltage threshold to access a fully programmed block and to use a second read voltage threshold, different from the first read voltage threshold, to access a partially programmed block.

17. A system comprising:
    a non-volatile storage device comprising a non-volatile storage medium; and
    a controller for the non-volatile storage device, that
       manages variation of erase dwell times for blocks of the non-volatile storage medium,
       categorizes the blocks into groups based on retention times, and
       configures different groups to use different read voltage thresholds based on the retention times.

18. The system of claim 17, wherein the controller updates a read voltage threshold for a block in response to regrouping the block based on a change in a retention time for the block.

19. The system of claim 17, wherein the controller updates a read voltage threshold for at least one of the groups in response to a change in a program/erase count.

20. The system of claim 17, wherein the controller comprises one or more of a hardware controller for the non-volatile storage device and a device driver for the non-volatile storage device, the device driver comprising computer executable code stored on a non-volatile computer readable storage medium.

* * * * *